United States Patent [19]

Hemming et al.

[11] Patent Number: 5,063,350
[45] Date of Patent: Nov. 5, 1991

[54] ELECTROSTATIC SPRAY GUN VOLTAGE AND CURRENT MONITOR

[75] Inventors: Dale R. Hemming, Fridley; Lawrence J. Lunzer, St. Louis Park; Robert J. Lind, Robbinsdale, all of Minn.

[73] Assignee: Graco Inc., Minneapolis, Minn.

[21] Appl. No.: 478,277

[22] Filed: Feb. 9, 1990

[51] Int. Cl.⁵ ............................................. G01R 29/12
[52] U.S. Cl. ...................................... 324/457; 361/227
[58] Field of Search ................. 324/457, 458; 340/650; 361/227, 228; 239/3

[56] References Cited

U.S. PATENT DOCUMENTS

| | | |
|---|---|---|
| 1,869,384 | 8/1932 | MacLachlan . |
| 2,742,600 | 4/1956 | Lamm ........................ 321/2 |
| 2,922,584 | 1/1960 | Slatkin ....................... 239/245 |
| 3,081,629 | 3/1963 | Clauss et al. .............. 73/205 |
| 3,641,971 | 2/1972 | Walberg ..................... 118/8 |
| 3,645,447 | 2/1972 | Cowan ....................... 239/15 |
| 3,851,618 | 12/1974 | Bentley ..................... 340/650 |
| 4,000,443 | 12/1976 | Lever ......................... 361/228 |
| 4,073,002 | 2/1978 | Sickles et al. ............. 361/227 |
| 4,262,254 | 4/1981 | Poss ........................... 324/457 |
| 4,266,262 | 5/1981 | Haase, Jr. .................. 361/228 |
| 4,290,091 | 9/1981 | Malcolm .................... 361/228 |
| 4,339,721 | 7/1982 | Nihira et al. .............. 324/457 |
| 4,370,616 | 1/1983 | Williams ................... 324/458 |
| 4,377,838 | 3/1983 | Levey et al. .............. 361/228 |
| 4,634,057 | 1/1987 | Coffee et al. ............. 239/690 |
| 4,650,003 | 3/1987 | Euson ........................ 169/60 |
| 4,682,735 | 7/1987 | Mommsen ................. 324/72 |
| 4,737,887 | 4/1988 | Thome ....................... 361/228 |
| 4,745,520 | 5/1988 | Hughey ..................... 361/228 |
| 4,838,487 | 6/1989 | Schneider ................. 239/223 |

Primary Examiner—Kenneth A. Wieder
Assistant Examiner—Maura K. Regan
Attorney, Agent, or Firm—H. Dale Palmatier; Paul L. Sjoquist

[57] ABSTRACT

A device and method of determining the voltage and current existing at the electrostatic electrode in a electrostatic spray gun, the spray gun containing a self-contained power supply including a turbine generator operating the air supplied to the gun, the power supply producing a low voltage d.c., and a voltage multiplier changing the voltage to a high potential which is applied to the electrode of the spray gun, a sensing and measuring circuit for determining the return current or ground current from the electrode to the power supply and producing a voltage directly related to the ground current and producing a voltage signal which may be measured directly to indicate the ground current; a circuit establishing a base voltage from the power supply for comparison against the ground current voltage signal and obtaining a differential voltage which may be measured and which is directly proportional to the electrode voltage.

7 Claims, 4 Drawing Sheets

ELECTROSTATIC SPRAY GUN VOLTAGE AND CURRENT MONITOR

This invention relates to electrostatic spray guns for spraying paint and the like, and more specifically relates to an indicator of the voltage and current on the electrostatic electrode in the spray gun.

BACKGROUND OF THE INVENTION

In the use of electrostatic spray guns, there is a need to know the level of voltage existing at the electrostatic electrode during operation of the spray gun. Firstly, the voltage and current are helpful in indicating that the spray gun is operating properly; and secondly, the voltage and current may indicate certain information about the details of the application of paint spray to the parts or media being sprayed.

It must be assumed that an electrostatic spray gun will be operated in an environment containing highly volatile or flammable materials, and accordingly, the possibility of explosions must always be kept in mind where there is an inclination to transmit information which would ordinarily be transmitted by electrical wiring. Presently, electrostatic spray guns are known to operate without any electrical connections whatever to external circuitry or power sources; and the only power supplied to the electrostatic spray gun is by way of high pressure air transmission wherein the air is used for spraying the paint and is also used to drive a self-contained turbine-generator within the electrostatic spray gun body, the output from such a generator being used to establish the high voltage applied to the electrostatic electrode in the spray gun.

SUMMARY OF THE INVENTION

An object of the invention is to provide an indication of the voltage and current existing on the electrostatic electrode of an electrostatic spray gun.

A feature of the invention is to measure and provide an indication within the electrostatic spray gun of the ground return current between the high voltage multiplier ground and the ground of the power supply. This ground current is directly related to the current established between the electrostatic electrode and through the paint being sprayed, and the part or media to which the paint is being applied, and also is inversely related to the voltage at the electrode of the spray gun.

The return current is determined by creating, in a detector circuit, a voltage signal proportional to the ground return current; and the voltage signal is introduced into a first or second order low pass Butterworth filter or similar filter and amplifier so that the voltage signal proportional to the ground return current is measurable. In practice, it has been found practical to set the ground current indicating voltage signal at one volt whenever the ground current is at 200 microamps.

In order to convert the ground current voltage signal into an indication of electrostatic electrode voltage, a base voltage is established for purposes of comparing the ground current voltage signal to it. The d.c. voltage, which is directly proportional to the turbine generator or other source output voltage, is selected in the power supply. The d.c. voltage is applied to an active first or second order low pass Butterworth filter or other similar filter with a cutoff frequency between 0.1 to 10 hertz, wherein the d.c. voltage is changed to a known base voltage. In practice, it has been found practical to adjust the base voltage to one volt at no-load condition, i.e. 60 kv at the electrode. The power supply d.c. voltage applied to the Butterworth filter is approximately twelve volts; and the base voltage at the output of the Butterworth filter is one volt and is to be compared to the voltage signal proportional to ground current.

In the event that the turbine generator or other source output voltage to the power supply is lowered, intentionally or unintentionally, the electrostatic electrode voltage and ground current will be also lowered below the normal operating conditions. However, the base voltage will also be proportionally reduced and therefore the output indicator voltage will still correctly indicate the electrostatic electrode voltage.

The base voltage and the ground current voltage signal are applied into a subtracting circuit and a differential voltage, which may be referred to as the output indicator, at the output of the subtracting circuit may be measured by a voltmeter and is directly proportional to the high voltage at the electrostatic electrode of the spray gun. More specifically, when the voltage signal proportional to ground current approaches zero, the indication is that there is no ground current, and because the ground current and electrode voltage are inversely related, the ground current voltage signal of zero will indicate that the voltage at the spray gun electrode is at its maximum, i.e. 60 kv. In subtracting the ground current voltage signal, i.e. zero, from the one volt base voltage, the differential voltage will be one volt and the voltmeter output can be calibrated to indicate 60 kv at the gun electrode.

When the ground current voltage signal is at one volt, indicating maximum ground current flow, i.e. 200 microamps, the voltage at the gun electrode, which is inversely related to ground current, will be at a minimum level, i.e. zero volts. Accordingly, when such a one volt ground current voltage signal is subtracted from the base voltage of one volt, the indication of differential voltage at the voltmeter will be zero, which is calibrated to be zero volts at the gun electrode.

When the ground current indicating voltage signal is at an intermediate level, such as 0.5 volts, indicating approximately 100 microamps ground current, thus indicating the gun electrode voltage at approximately 30 kv, a subtraction of the ground current voltage signal, i.e. 0.5 volts, from the base voltage produces a differential voltage of 0.5 volts which is measured by the voltmeter, properly calibrated at 30 kv.

DETAILED SPECIFICATION

Figure 1:
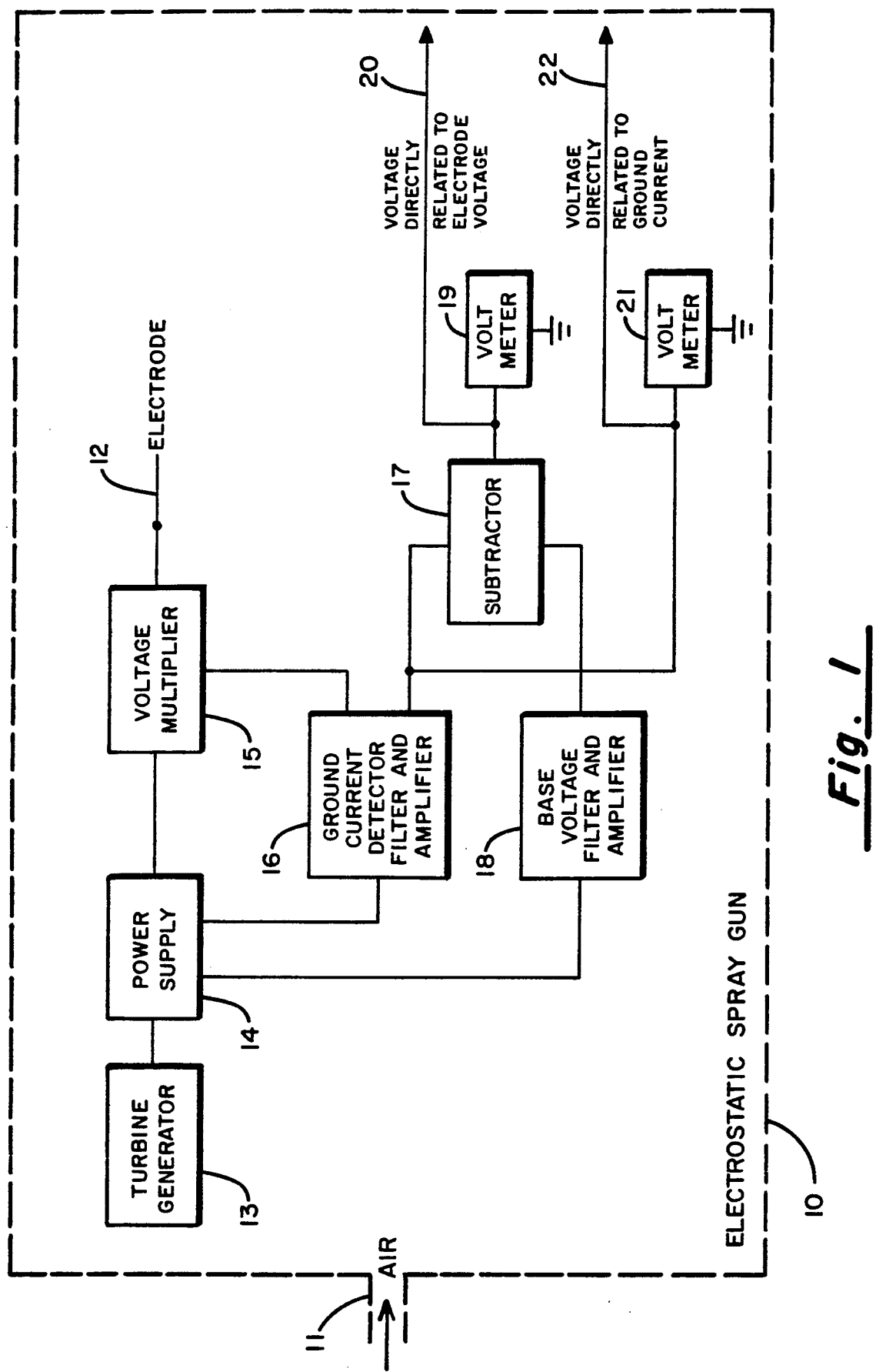
FIG. 1 is a block diagram illustrating the invention.

One form the the invention is shown in the drawings and is disclosed herein.

FIG. 1 illustrates, in block diagram, an electrostatic spray gun which is indicated in general by numeral 10 receiving air at the duct 11 to provide a source of power for the spray gun. The electrostatic spray gun has an electrostatic electrode 12 which, under normal operating conditions is charged to an extremely high potential, in the range of 60 kv in the spray gun in which the invention has been reduced to practice.

There is no electrical power supplied into the electrostatic spray gun 10, and in order that the electrode 12 be suitably charged, a turbine generator 13 in the spray gun is powered by the pressurized air. The electrical output from the turbine generator is supplied into a power supply 14, the output of which is a d.c. current and voltage. The output from the power supply is used to operate a voltage multiplier circuit 15, the output from which has a magnitude of approximately 69 kv to obtain proper operation of the spray gun 10.

The ground current or return current from the voltage multiplier to the power supply is detected and sensed by a Butterworth filter and amplifier 16 and produces a varying ground current voltage signal at its output which is supplied into a subtractor or summing circuit 17. The power supply is also connected to a Butterworth filter and amplifier 18 and supplies to the filter and amplifier 18 a voltage which is directly proportional to the turbine generator output voltage or other output voltage if a different source of power were to be used. While the d.c. voltage supplied to the base voltage filter and amplifier is ordinarily a constant during normal operating conditions, the voltage supplied to the base voltage filter and amplifier 18 may be reduced in the event the turbine generator is not operating at rated speed, or for other similar reasons. The output from the base voltage filter and amplifier 18 is also applied into the subtractor or summing circuit 18.

During normal operating conditions, the output from the base voltage filter and amplifier will be constant and is nominally set at one volt, under a no load condition of the spray gun and when the normal 69 kv voltage exists at the electrode 12.

Similarly, the output voltage from the ground current detector and filter and amplifier 16 is adjusted to a nominal one volt under conditions of maximum ground current from the voltage multiplier or approximately 200 micro amps; and the voltage output from the ground current detector filter and amplifier 16 will reduce to approximately 0 when the return ground current from the voltage multiplier to the power supply approaches 0.

The output from the subtractor 17 is a differential of voltage between the base voltage from the amplifier 18, and the ground current voltage signal from the filter and amplifier 16. The output from the subtractor is directly and proportionately related to the actual voltage or potential at the electrode 12 and may be measured by a volt meter 19. Additionally, another conductor or probe 20 may be available for applying the differential voltage for other purposes.

Similarly, the ground current voltage signal from the filter and amplifier 16 may be applied to a volt meter 21 which will provide a reading directly proportional to the return ground current between the voltage multiplier and the power supply. An additional output conductor or probe 22 may be provided for applying the ground current voltage signal for other purposes.

Figure 2:
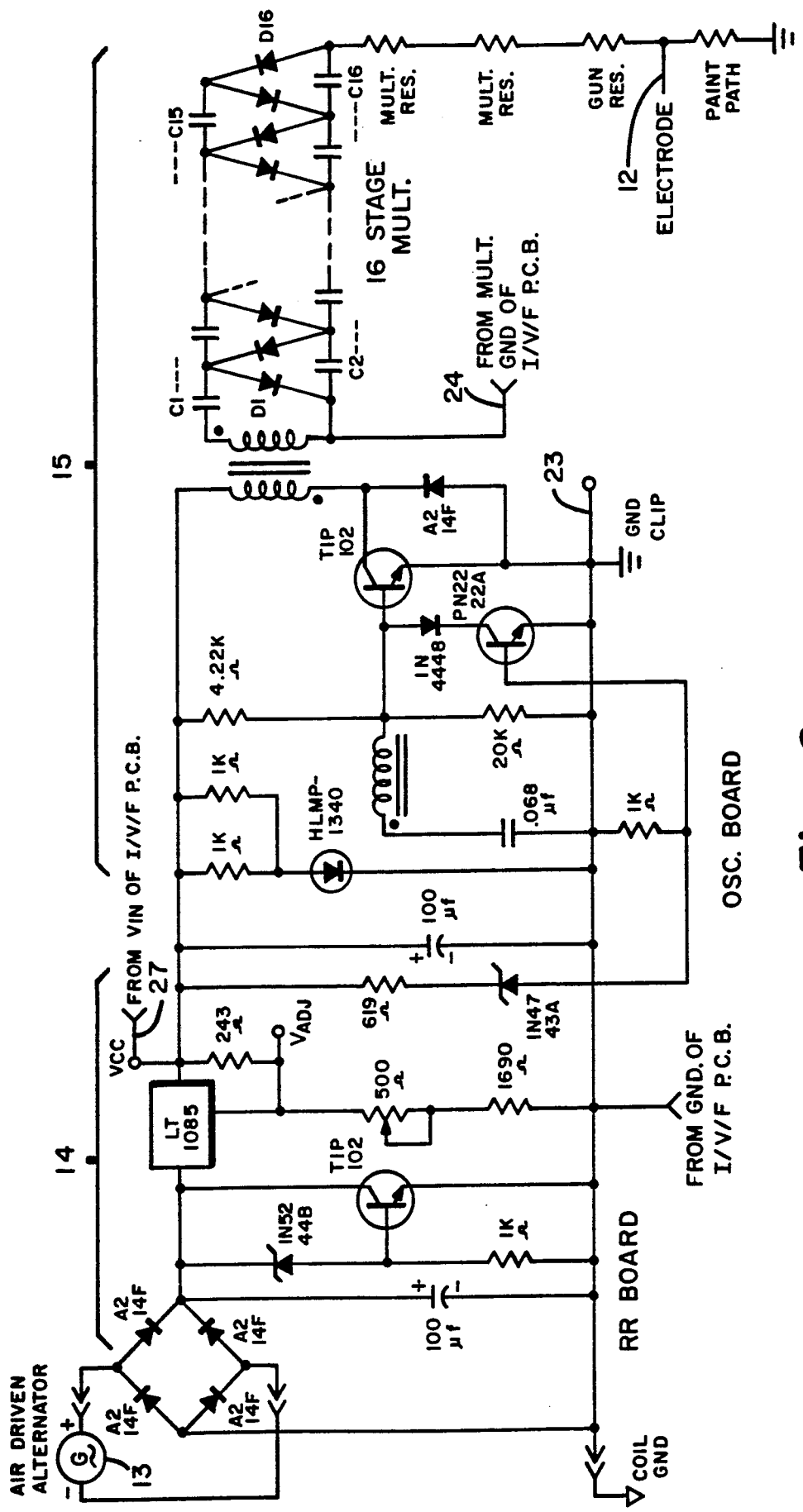
FIG. 2 is a schematic circuit diagram illustrating a portion of the invention.
Figure 3:
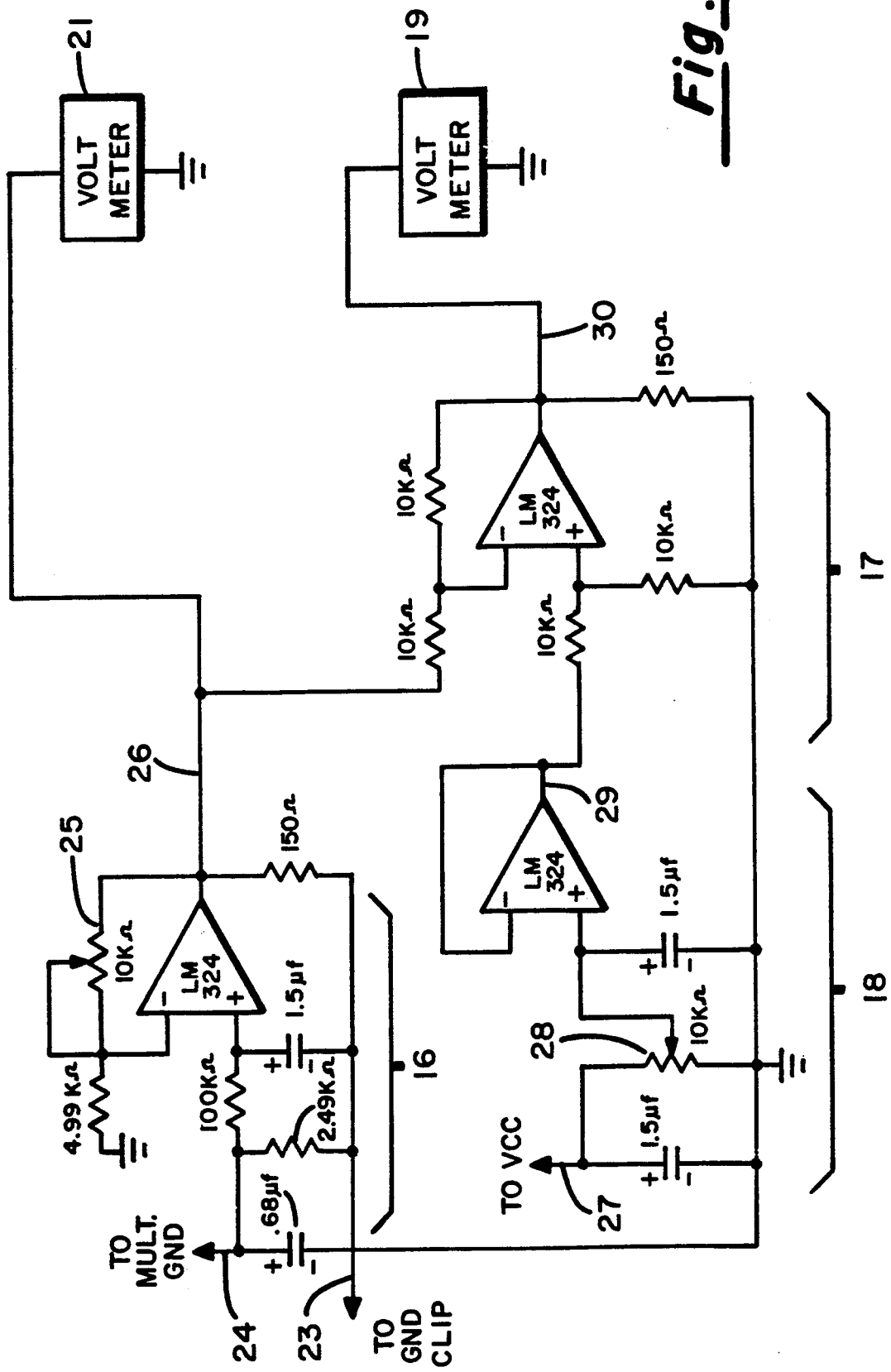
FIG. 3 is a schematic circuit diagram illustrating a continuation of the circuit illustrated in FIG. 2.

The schematic circuits of FIGS. 2 and 3 are both confined within the body of the spray gun 10.

Points 23 in FIGS. 2 and 3 are common, and points 24 in the FIGS. 2 and 3 are common. The entire return or ground current from the voltage multiplier and electrode to the power supply passes between the points 23 and 24. The ground current detector Butterworth filter and amplifier 16 are indicated in FIG. 3 and are shown to be connected across the connector points 23 and 24 to sense and obtain a measurement of the ground current. A potentiameter 25 is provided for adjusting the output from the amplifier to a predetermined nominal voltage, i.e., one volt as disclosed, when maximum ground current of 200 microamps is detected, the output from the amplifier being at conductor 26.

In FIGS. 2 and 3, points 27 are common and indicate the connection to the power supply whereby the Butterworth filter and amplifier 18 are connected to the d.c. output of the power supply which is designated in FIG. 2.

The output at connection 27 is constant during normal operating conditions, but may be reduced if the voltage output from the turbine generator is reduced. A potentiameter 28 is provided in the base voltage filter and amplifier 18 to adjust the output at conductor 29 to a nominal one volt when the spray gun 10 is operating at no load conditions and 60 kv exists at the electrode 12.

The varying ground current voltage signal at 26 may be applied directly to a volt meter 21 in the spray gun which will provide a direct reading of return or ground current which is related directly but inversely to electrode voltage.

The outputs from the filters and amplifiers 16, 18 are both applied into the subtractor circuit 17 which compares the two voltage outputs and produces a differential voltage output at conductor 30 which may be applied directly to the volt meter 19 which provides a direct and proportional indication of electrode voltage.

Figure 4:
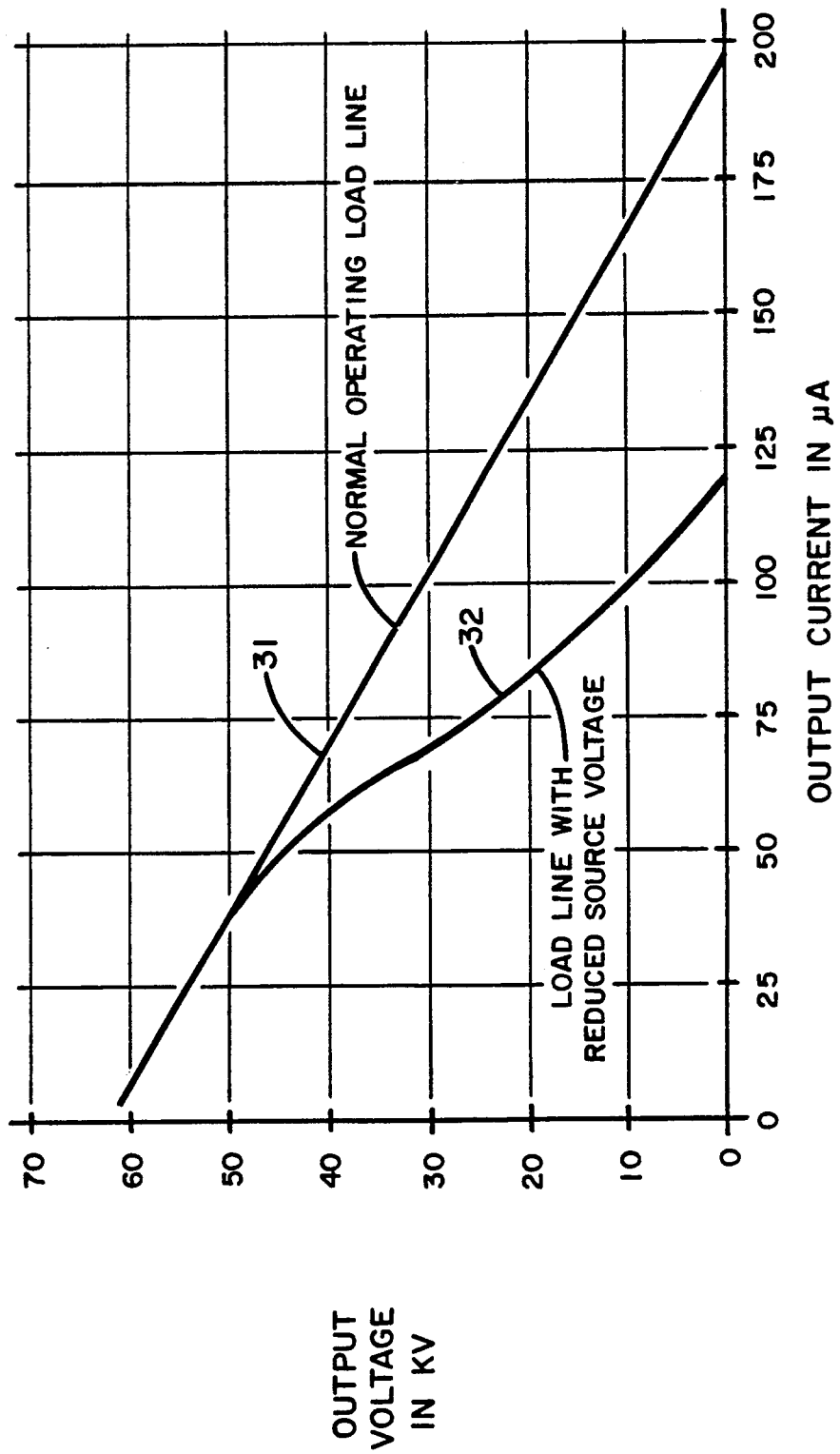
FIG. 4 is a graph showing the relation between output voltage an output current under normal operating conditions, and under conditions of reduced source voltage.

In FIG. 4, the output voltage at the electrode 12 is plotted against output current which is the same the ground current or return current which is measured. Under normal operating conditions when the turbine generator 13 is putting out a constant voltage and causing the voltage multiplier 15 to operate normally, the relationship between the output voltage and the output current or return current is a straight line function as indicated by the straight line 31 in FIG. 4. However, when the output voltage from the power supply or from the turbine generator is reduced as by in the event of a reduced air supply, the relationship between the output voltage and output current though not strictly proportional is still related, but the relationship is somewhat less than a linear relationship as indicated by the curve 32 in FIG. 4. Under these conditions represented by the curve 32, the reduced level of voltage supplied into the filter and amplifier 18 compensates for the different operating characteristics, but the comparison between the base voltage and the ground current indicating voltage signal 26 will remain accurate so that the differential voltage at 30 will continue to indicate the existing voltage at the electrode 12.

The indicator output provided by the volt meter 19 and also by the volt meter 21 provides an indication that the electrostatic spray gun 10 operating properly and may also give an indication as to certain characteristics of the spraying operation being conducted.

The present invention may be embodied in other specific forms without departing from the spirit or essential attributes thereof; therefore, the illustrated embodiment should be considered in all respects as illustrative and not restrictive, reference being made to the appended claims rather than to the foregoing description to indicate the scope of the invention.

We claim:

1. An indicating device of the voltage and current on an electrostatic spray gun electrode which is supplied from a power supply within the gun, comprising ground current sensing means detecting the ground current between the electrode and the power supply and producing a varying ground current voltage signal proportional to the varying ground current, a control means establishing a base voltage from the power supply with a magnitude which is directly related to the source output voltage to the power supply, and subtracting circuit means subtracting the ground current voltage signal from the base voltage and producing an output indicator directly proportional to electrode voltage.

2. The electrode voltage indicating device according to claim 1 wherein all of said sensing, control and subtracting circuit means are confined with the spray gun.

3. The electrode voltage indicating device according to claim 1 and a meter with a visual display on the spray gun and receiving the output indicator to produce a meter display output indicating electrode voltage and current.

4. An indicating device according to claim 1, and adjusting means to set at least one of the base voltage and ground current voltage signal in a predetermined relation to the other of said base voltage and voltage signal.

5. An indicating device according to claim 1, and the ground current sensing means having adjusting means to set the ground current voltage signal to a predetermined level when the ground current is maximized.

6. An indicator according to claim 1, and the control means having adjusting means to set the base voltage to a predetermined level when the ground current is minimized and the electrode voltage is maximized.

7. A method of determining the voltage on the electrostatic electrode of an electrostatic spray gun wherein the voltage is derived from a power supply in the spray gun, comprising detecting the ground current between the electrode and power supply and producing a measurable voltage signal proportional to the ground current, establishing a base voltage directly proportional to the electrode voltage under conditions of no spray load and equalizing the base voltage and the voltage signal under conditions wherein the ground current is maximized and the electrode voltage approaches zero, and subtracting the voltage signal from the base voltage to produce an output indicator voltage which is directly related to and may be calibrated to indicate electrode voltage.

* * * * *